US00RE37627E

(19) United States
(12) Reissued Patent
Hirano

(10) Patent Number: US RE37,627 E
(45) Date of Reissued Patent: Apr. 9, 2002

(54) WAFER CENTRIFUGAL DRYING APPARATUS

(75) Inventor: Yoshifumi Hirano, Miyazaki (JP)

(73) Assignee: Oki Electric Industry Co., Ltd., Tokyo (JP)

(21) Appl. No.: 09/451,128

(22) Filed: Nov. 30, 1999

Related U.S. Patent Documents

Reissue of:
(64) Patent No.: 4,777,732
Issued: Oct. 18, 1988
Appl. No.: 07/058,934
Filed: Jun. 5, 1987

(30) Foreign Application Priority Data

Jun. 12, 1986 (JP) ..... 61-134750
Jun. 13, 1986 (JP) ..... 61-136035

(51) Int. Cl.[7] ..... F26B 7/00
(52) U.S. Cl. ..... 34/426; 34/58; 34/186
(58) Field of Search ..... 34/426, 58, 184, 34/186, 187

(56) References Cited

U.S. PATENT DOCUMENTS

| | | | | |
|---|---|---|---|---|
| 3,727,620 A | | 4/1973 | Orr | |
| 3,769,992 A | | 11/1973 | Wallstad | |
| 3,990,462 A | | 11/1976 | Elftmann et al. | |
| 4,132,567 A | | 1/1979 | Blackwood | |
| 4,677,759 A | * | 7/1987 | Inamura | 34/58 |
| 4,907,349 A | * | 3/1990 | Aigo | 34/184 |

FOREIGN PATENT DOCUMENTS

| | | | |
|---|---|---|---|
| DE | 925 817 | | 3/1955 |
| DE | 28 22 446 | | 1/1980 |
| GB | 527712 | | 10/1940 |
| GB | 846439 | | 8/1960 |
| JP | 58-38159 | | 10/1978 |
| JP | 55-154736 | | 2/1980 |
| JP | 56-8823 | | 1/1981 |
| JP | 57-56930 | | 4/1982 |
| JP | 160130 | * | 10/1982 |
| JP | 36930 | * | 2/1984 |
| JP | 59-77224 | | 5/1984 |
| JP | 59-104065 | | 6/1984 |
| JP | 59-172238 | | 9/1984 |
| JP | 59-202383 | | 11/1984 |
| JP | 60-106135 | | 6/1985 |
| JP | 60-257525 | | 12/1985 |
| JP | 61-17732 | | 2/1986 |
| JP | 61-20049 | | 2/1986 |
| JP | 61-129340 | | 8/1986 |
| JP | 61-179741 | | 11/1986 |
| JP | 62-9635 | | 1/1987 |
| JP | 62-62528 | | 3/1987 |
| JP | 4-56452 | | 9/1992 |

OTHER PUBLICATIONS

Special Edition/Recent Super LSI Technology and Manufacturing Device—Spin Dryer For Super LSI; Ref. No.: 66098.0017, Mar. 1983.

Two–Position Device Allowing A centrifugal Machine Spinning About A Vertical Axis to Be Automatically Loaded With–Two Wafer Carriers; *IBM Technical Disclosure Bulletin;* vol. 29, No. 5; Oct. 1986.

FSI Turntable Drawing Part No. 2971–002, FSI Corporation, 1981.

Sales Document Back Order Part No. 2971–002 To National Semiconductor, Jul. 1982.

(List continued on next page.)

*Primary Examiner*—Stephen Gravini
(74) *Attorney, Agent, or Firm*—Rabin & Champagne, P.C.

(57) ABSTRACT

A centrifugal wafer drying apparatus comprises a rotor rotatably disposed in a container, a cradle mounted on the rotor, and a carrier mounted in the cradle and having grooves for receiving wafers. The carrier holds the wafers at an oblique angle with respect to a plane normal to the axis of rotation of the rotor, at least during rotation of the rotor.

37 Claims, 5 Drawing Sheets

OTHER PUBLICATIONS

Sales Document Back Order Part No. 2971–002 To Dryden Engineering Co., May 1982.
FSI Turntable Drawing, Part No. 2930, 1982.
FSI Turntable Drawing, Part No. 2952, 1981.
FSI Turntable Drawing, Part No. 2958, 1981.
FSI Turntable Drawings, 1982.
FSI Turntable Catalog, Jul., 1984, pp. 3, 4, 6, 8, 18, 20, 22, 29, 31.

* cited by examiner

WAFER CENTRIFUGAL DRYING APPARATUS

Matter enclosed in heavy brackets [ ] appears in the original patent but forms no part of this reissue specification; matter printed in italics indicates the additions made by reissue.

BACKGROUND OF THE INVENTION

The present invention relates to a centrifugal wafer drying apparatus used for drying after washing a semiconductor wafer such as a silicon wafer.

FIGS. 1A and 1B show a prior art centrifugal wafer drying apparatus having carriers 2 each receiving silicon wafers in a stack. Each of the carriers 2 has grooves 3 for accomodating wafers 1. Each of the grooves 3 extends along substantially half a periphery of a wafer 1, and has clearance with respect to the thickness of the wafer, e.g., it has a thickness of two to three times the thickness of the wafer to facilitate loading (insertion) and unloading (removal) of the wafer. The apparatus further comprises a cylindrical container 4, and cradles 5 made of stainless-steel disposed in the container 4 to hold the carriers 2. The cradles 5 are mounted on a rotor 6, which is fixed to a rotor shaft 7. The rotor shaft 7 is driven by a motor 8, so that the rotor 6 rotates together with the cradles mounted thereon. Water remaining on the wafers disperse due to the centrifugal force and the wafers 1 are thereby dried.

FIG. 2A and FIG. 2B are a plan view and a partial side view of the rotor 6. The rotor 6, disposed in the container 4 has an opening 6a, through which clean air, which has passed a filter (not shown) provided in a lid 4a of the container 4, is supplied into the rotor 6 and air streams 11 (FIG. 3) are created along the surfaces of the wafers 1, being limited by walls 6b acting as guides. The air streams also serve to disperse water from the surfaces of the wafers 1.

Each of the cradles 5 is pivotably mounted on a pivot pin 5a extending at right angles with the rotor shaft 7 and with the direction of a radius from the axis of rotation RX which is an extension of the axis of the rotor shaft 7. Each of the cradles 5 is pivotable between the positions A and B, about 90°, as indicated by an arrow C. At the position A, the rotor is at rest and carriers 2 are loaded in or unloaded from the cradle 5. For this purpose, the cradles 5 each have an opening 5b which faces upward for loading and unloading of the carrier. Each of the carriers 2 has an opening 2a for loading and unloading of wafers in and out of the grooves 3. The opening 2a of the carrier 2 also faces upward when the cradle is at the position A. The cradle 5 is at the position B while the rotor 6 is rotating.

When the cradle 5 is at the position B, the opening 2a of the carrier 2 faces the axis of rotation RX of the rotor. At the position B, half the periphery of each wafer that is covered by the groove is positioned on the radially outer side with respect to the axis RX of rotation of the rotor 6. At the position B, the cradle 5 is engaged with a cradle stopper 9. The stopper 9 is provided to hold the cradle 5 in such a position that the surfaces of the wafers 1 are substantially orthogonal to the axis of rotation of the rotor 6.

Examples of prior art references showing this type of drying apparatus are Japanese Patent Application Laid-open No. 36930/1984, Japanese Patent Application Laid-open No. 160130/1982 and Japanese Patent Application Laid-open No. 8823/1981.

The above-described apparatus however has a disadvantage. This is explained with reference to FIG. 3, which is a section view taken along the periphery of wafers as received by the grooves. When the rotor 6 is at rest, the wafers 1 are at positions D where the lower surfaces 1a of the wafers 1 abut upwardly-facing edges 3a of the grooves 3. This is due to gravity. When the rotor 6 is rotating, the centrifugal force acts in the direction F, substantially parallel with the surfaces of the wafers 1, so that the wafers 1 vibrate between the position D, and the position E where the upper surfaces 1b abut the downwardly-facing edges 3b of the grooves 3. The actual condition which the individual wafers assume is affected by the air stream or wind caused by the rotation of the rotor. Thus, the resultant vibration of the wafers generates dust from the parts of the wafers 1 and the grooves 3 where they collide with each other. The vibration of the wafer also causes the air stream 11 to be unstable, and the effect of the water removal by the air stream 11 is reduced. The result is an unsatisfactory drying.

SUMMARY OF THE INVENTION

An object of the invention is to prevent vibration of the wafers, thereby to reduce generation of dust and to improve the effect of removing water.

According to the invention, grooves holding the wafers are inclined with respect to a plane normal to the axis of rotation so that during rotation, each of the wafers is held against one of the edges, for instance downwardly-facing edge of the groove. The grooves can be inclined by inserting a spacer between the cradle stopper and the cradle. The angle of inclination is preferably within the range of 2.5° to 30°.

With the above structure, the wafers are stably held in the grooves abutting one of the edges by the action of the centrifugal force. Accordingly, vibration of the wafers is prevented. As a result, the generation of dust is reduced. Moreover, the air streams around the wafers are stabilized and the effect of removing water is improved.

DETAILED DESCRIPTION OF THE PREFERRED EMBODIMENTS

Figure 5:
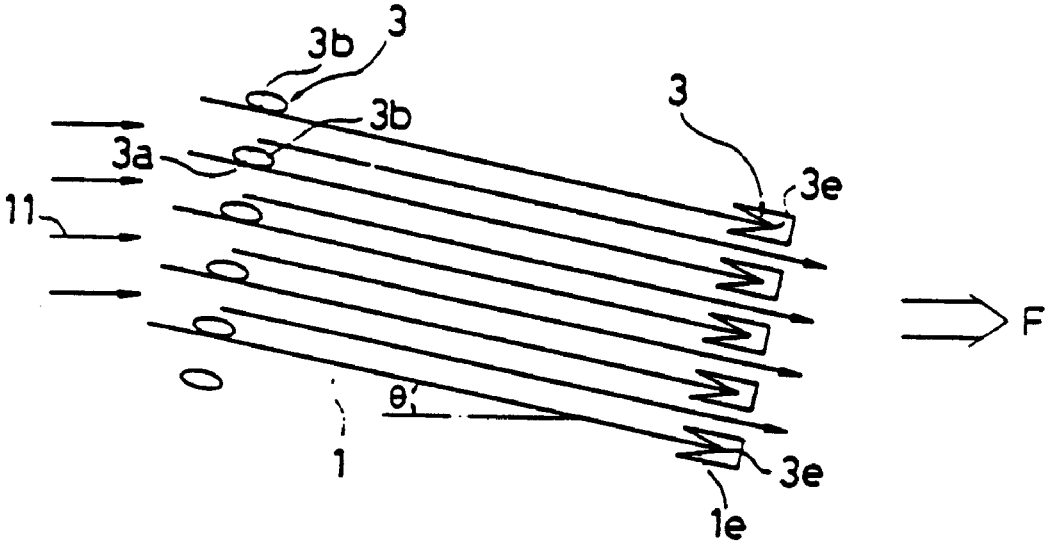
FIG. 5 is a schematic sectional view, similar to FIG. 3, showing how the vibration of the wafers can be eliminated.
Figure 4:
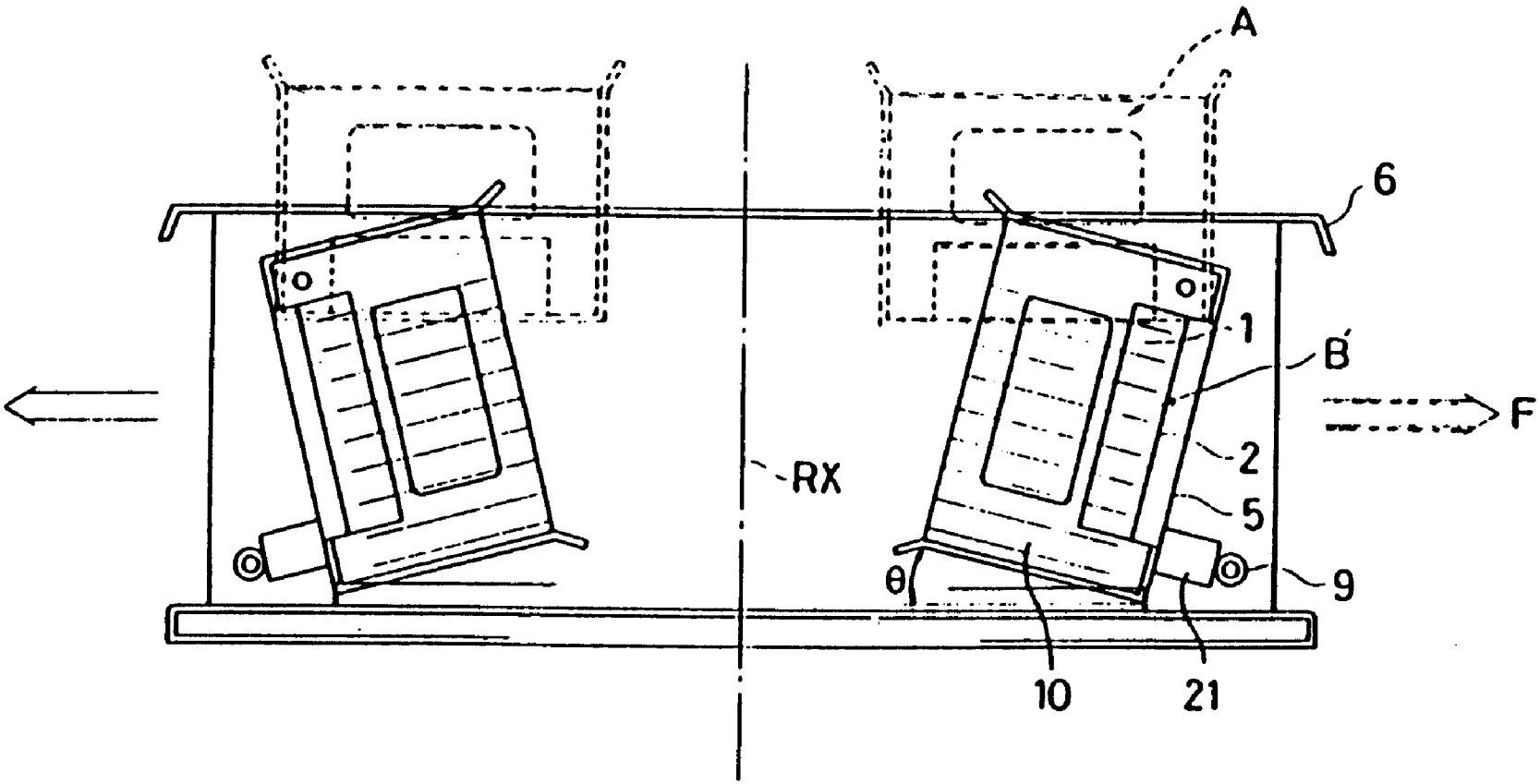
FIG. 4 is a side view showing an embodiment of the invention.

FIG. 4 and FIG. 5 show a centrifugal wafer drying apparatus of an embodiment of the invention.

Figure 1A:
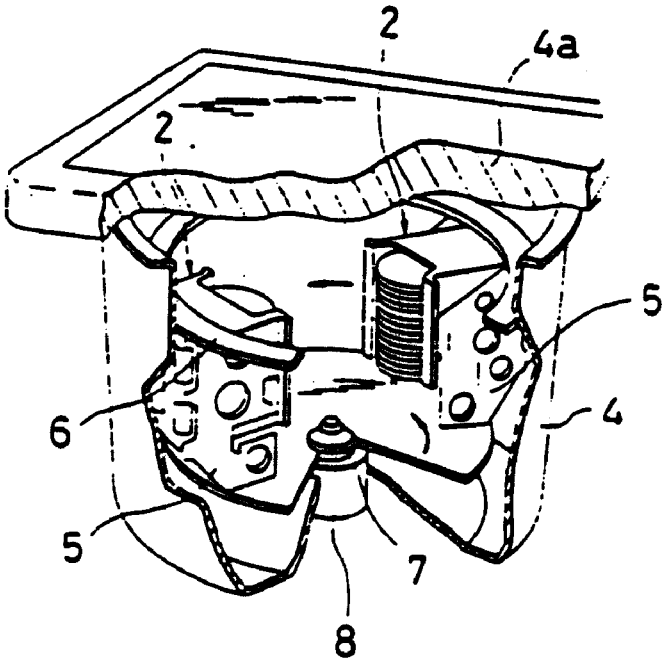
FIG. 1A PRIOR ART
FIG. 1A is a perspective view, partially broken away, showing the general construction of a centrifugal wafer drying apparatus.
Figure 1B:
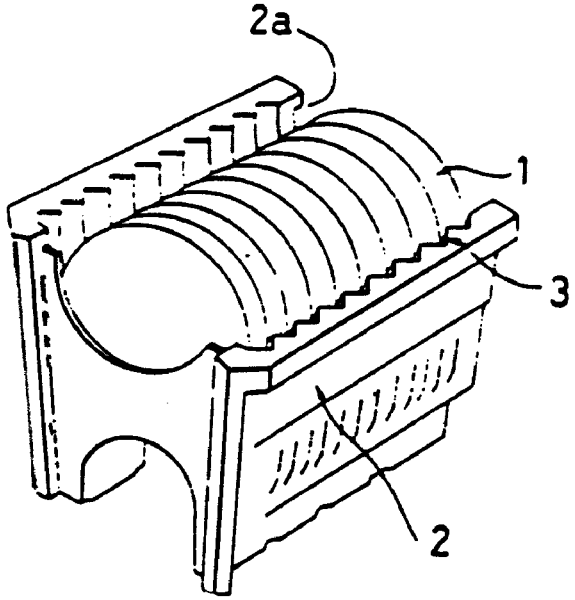
FIG. 1B PRIOR ART
FIG. 1B is a perspective view showing a cradle for accommodating wafers.
Figure 2A:
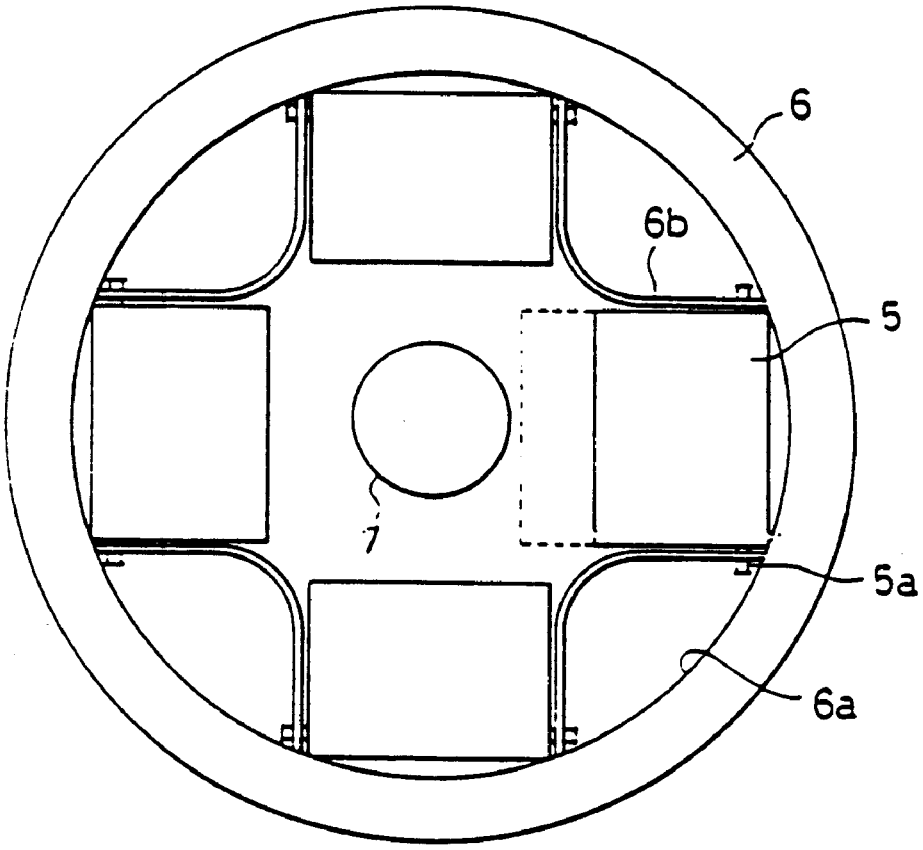
FIG. 2A PRIOR ART
FIG. 2A is a plan view showing a rotor on which cradles are mounted.
Figure 2B:
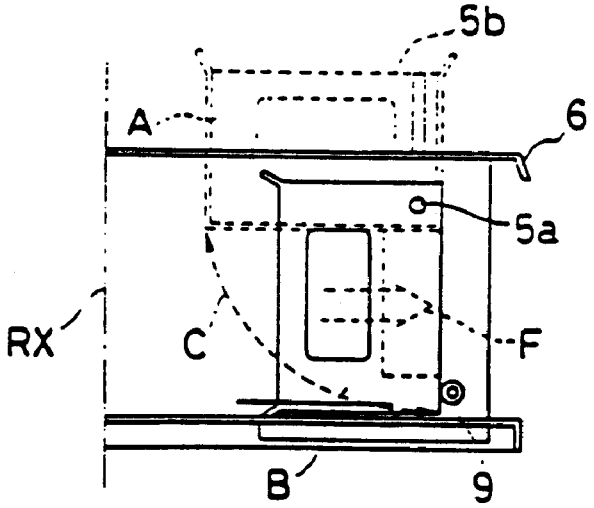
FIG. 2B PRIOR ART
FIG. 2B is a partial side view of the rotor.

The general construction of the centrifugal wafer drying apparatus of this embodiment is similar to that shown in FIG. 1A, FIG. 1B and FIG. 2A, and the description made with reference to these figures also applies. Moreover, the description made with reference to FIG. 2B also applies in so far as it does not contradict the features shown in FIG. 4 and FIG. 5. According to the features of the embodiment as shown in FIG. 4 and FIG. 5, a spacer 21 is provided for each of the cradles and is fixed to the bottom wall of the cradle 5 to abut the cradle stopper 9 when the cradle is rotated downward. When the spacer 21 abuts the cradle stopper 9, the cradle 5 is inclined, and the carrier 2 accommodated in the cradle 5 and the grooves 3 of the carrier 2 in which the wafers 1 are inserted are inclined with respect to the plane normal to the axis RX of rotation of the rotor. The direction of inclination is such that a radially outer extremity 1e of each wafer positioned radially outward with respect to the axis RX of rotation is at the lowest height. This is advantageous because gravity does not cause the wafer to slide down out of the groove. Moreover, the angle of rotation of the cradle from the position A to the position B' can be reduced. The angle θ of inclination is 11°, for example. In this position B', the rotor 6 rotates. The wafers 1 are then rotated keeping the angle of inclination, without vibration and held at an unequivocal position.

Figure 3:
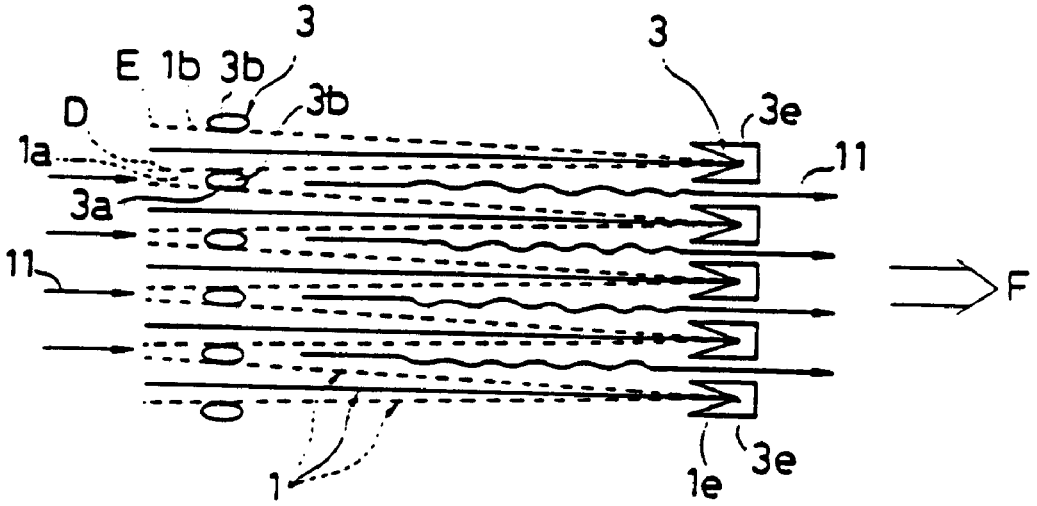
FIG. 3 PRIOR ART
FIG. 3 is a schematic sectional view showing how the wafers vibrate within the grooves.

This will be explained with reference to FIG. 5, which shows a cross section along the same line as FIG. 3. As illustrated, when the grooves are inclined in the upward direction as shown in FIG. 5, the centrifugal force F serves to press the wafers 1 against the downwardly-facing edges 3b of the grooves and the wafers 1 are kept in this state. As a result, the vibration of the wafers 1 is prevented, and the generation of dust from those parts of the wafers 1 and the grooves 3 is reduced. Moreover, because the vibration of the wafers 1 is eliminated, the air streams around the wafers 1 are stabilized, and the effect of removing water from the wafers 1 is improved.

To prevent the vibration of the wafers, the angle θ of inclination must be large enough to create a greater moment than that of gravity while the rotor 6 is rotating at the designed speed. The moment exerted by the centrifugal force F is clockwise in FIG. 5 and about a point at which the radially outer extremity 1e of the wafer and the extremity 3e of the groove engage. The moment due to the gravity is counterclockwise. For example, when the rotor rotational speed is 1000 rpm, and the distance from the center of gravity of the wafer and the axis of rotation is 190 mm, the angle θ of inclination must be not smaller than 2.5° to prevent vibration of the wafer. Preferably, the angle θ should be not smaller than 11° to completely suppress the vibration. The minimum inclination angles, θ min, to completely suppress the vibration for the respective rotational speed N under the above condition are given below:

| N (rpm) | #min (*) |
|---|---|
| 600 | 20 |
| 800 | 17 |
| 1000 | 11 |
| 1200 | 8 |
| 1400 | 5 |

The maximum inclination angle θmax, which is about 30° in the embodiment illustrated, is given where the air streams are blocked and the drying of the rear or upper surfaces of the wafers 1 is incomplete. Moreover, with a commonly-employed construction of the drying apparatus, a protruding part of the cradle 5 abuts an inner or lower surface of the lid 4a of the container 4. The inclination angle θ should therefore be within the range of 2.5° to 30°.

For evaluating the centrifugal wafer drying apparatus of the above described embodiment, various tests were carried out. The wafer 1 had a diameter of 125 mm. The rotor 6 was rotated at 1000 rpm for 70 seconds. The inclination angle θ was 11°. Similar tests were also carried out with a conventional centrifugal wafer drying apparatus, for the purpose of comparison. The results are as follows:

(a) Dust

The wafer (test piece) was dipped in water and dried by rotation. The number of dust particles of not smaller than 0.3 micrometer that were attached during the rotation was counted. A wafer surface defect inspector was used for the counting. The same test was carried out 12 times, and the numbers of the dust particles counted were averaged.

(a1) With the conventional arrangement, the average number was 31.

(a2) According to the invention, the average number was 24.3

(b) Removal of water

Figure 6:
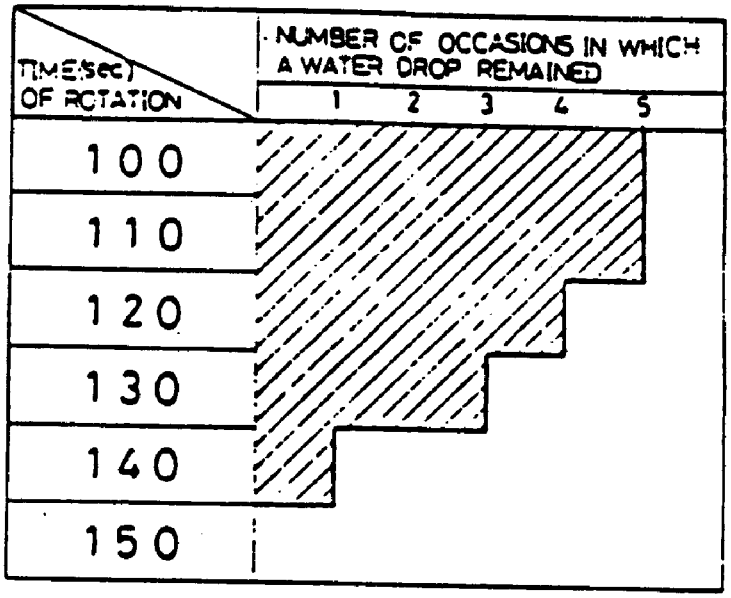
FIG. 6 and FIG. 7 are histograms showing the performance of drying of the conventional arrangement and a centrifugal wafer drying apparatus according to the invention.
Figure 7:
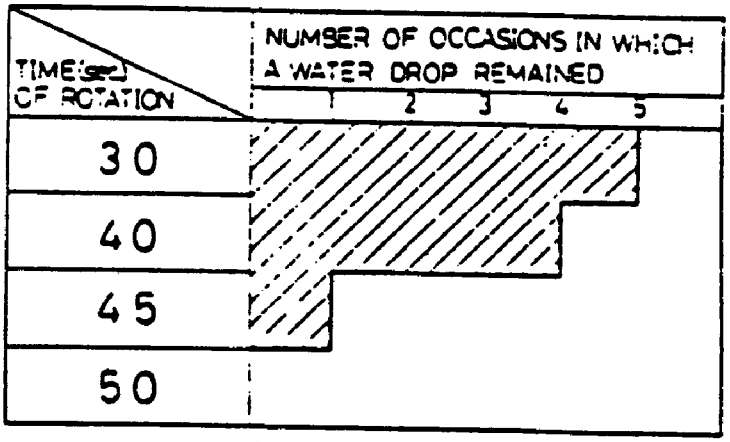

The wafer (test piece) was dipped in water, dried by rotation, and examined to ascertain whether a water drop remained. The same test was repeated five times for each time length of rotation (for which the rotor was rotated) as is shown at the left end of the histograms of FIG. 6 and FIG. 7. This indicates how many times out of the five trials a water drop remainder after drying by rotation. As seen from the histrograms, the conventional apparatus took 150 sec. to achieve complete drying without failure, while the apparatus according to the invention took only 50 sec.

Thus it is clear that inclining the wafers results in better drying and less dust. The invention therefore contributes to improvement in the yield and improvement in the productivity of the wafers.

In the embodiment described, the spacer 21 is fixed to the bottom surface of the cradle 5, and is made to abut the cradle stopper 9. Alternatively, the spacer 21 may be fixed to the cradle stopper 9, or the cradle stopper 9 itself may be shifted. It may be so arranged that the position of the cradle stopper 9 is adjustable to make the inclination angle variable. Moreover, the manner of hanging the cradle can be changed. For instance, the position of the pivot pin 5a can be changed to change the angle θ.

In the embodiment described the grooves are so formed that the wafers inserted therein are normal to the direction of the stack along which the wafers are stacked. Alternatively, the grooves can be formed to extend obliquely so that the wafers inserted therein are oblique with respect to the direction of the stack. In such a case, the spacer 21 can be eliminated.

Various other modifications can be made without departing the scope and the spirit of the invention.

What is claimed is:

1. A centrifugal wafer drying apparatus comprising a container *having an opening through which air is supplied*, a rotor rotatably disposed in the container, being rotatable about an axis of rotation, a cradle mounted on the rotor, and a carrier mounted in the cradle and having grooves for receiving wafers, the carrier holding the wafers at an oblique angle with respect to a plane normal to the axis of rotation of the rotor, at least during rotation of the rotor.

2. An apparatus according to claim 1, wherein the oblique angle is within the range of about 2.5° to about 30°.

3. An apparatus according to claim 1, wherein the cradle is pivotable about a pivot axis at right angles with the axis of rotation of the rotor, the cradle being pivotable between a first position at which the carrier can be loaded in and unloaded out of the cradle and a second position at which the cradle is held during rotation of the rotor.

4. An apparatus according to claim 3, wherein the carrier has an opening for loading an unloading the wafers in and out of the grooves, the opening facing the axis of rotation when the cradle is in the second position.

5. An apparatus according to the claim 3, wherein each of the grooves extend to cover half of the periphery of a wafer that is positioned on the radially outer side with respect to the axis of rotation of the rotor when the cradle is in the second position.

6. An apparatus according to claim 3, wherein the carrier receives wafers in a stack, the surfaces of the wafers are substantially normal to the direction of the stack, and the direction of the stack is inclined with respect to the axis of rotation of the rotor when the cradle is in the second position.

7. An apparatus according to claim 1, wherein the grooves have a clearance with respect to the thickness of the wafer.

8. An apparatus according to claim 1, wherein the carrier has an opening for loading and unloading the wafers in and out of the grooves, the opening facing the axis of rotation when the rotor is rotating.

9. An apparatus according to claim 1, wherein each of the grooves extend to cover half of the periphery of a wafer that is positioned on the radially outer side with respect of the axis of rotation of the rotor when the rotor is rotating.

10. An apparatus according to claim 1, wherein the carrier receives wafers in a stack, the surfaces of the wafers are substantially normal to the direction of the stack, and the direction of the stack is inclined with respect to the axis of rotation of the rotor when the rotor is rotating.

11. A wafer centrifugal drying apparatus comprising*:*

*a container having an opening through which air is supplied,* a rotor rotatable about a substantially vertical axis, and a carrier mounted on the rotor and having grooves for receiving wafers, the carrier holding the wafers at an oblique angle with respect to a plane normal to the axis of rotation of the rotor, at least during rotation of the rotor.

12. A method of drying a semiconductor wafer*, having a surface that was previously wetted with a liquid,* by rotation to exert a centrifugal force*, and by an air stream,* on the wafer, said method comprising rotating the wafer about an axis of rotation, [and]

holding the wafer in a manner such that the surface of the wafer is inclined *at a fixed angle* with respect to a plane normal to the axis of the rotation*, and*

*supplying air to the inclined wafer so as to create the air stream around the surface of the wafer*.

13. A method according to claim 12, wherein the angle of inclination is within the range of about 2.5° to about 30°.

14. An apparatus according to claim 11, wherein the oblique angle is within the range of about 2.5° to about 30°.

15. An apparatus according to claim 1, further comprising means for holding the cradle at a fixed position relative to the rotor to maintain the wafers at the oblique angle relative to the plane normal to the axis of rotation of the rotor during rotation of the rotor.

16. An apparatus according to claim 1, wherein the wafers are pressed against and maintained against an upper portion of the grooves during rotation of the rotor.

17. An apparatus according to claim 11, further comprising means for holding the cradle at a fixed position relative to the rotor to maintain the wafers at the oblique angle to the plane normal to the axis of rotation of the rotor during rotation of the rotor.

18. An apparatus according to claim 11, wherein the wafers are pressed against and maintained against an upper portion of the grooves during rotation of the rotor.

19. A method according to claim 12, wherein the step of holding the wafer further includes; holding the wafer in a groove within a carrier and pressing and maintaining the wafer against an upper portion of said grooves during rotation of the wafer.

20. A centrifugal wafer drying apparatus comprising a container *having an opening through which air is supplied*;

a rotor rotatably disposed in said container, said rotor being rotatable about an axis of rotation;

a cradle mounted on said rotor;

a carrier mounted in said cradle, said carrier having grooves for receiving said wafers; and a stop means for holding said cradle at a fixed position relative to said rotor to maintain said wafers at an oblique angle relative to a plane normal to said axis of rotation.

*21. An apparatus according to claim 1, wherein the container opening is in fluid communication with the grooves.*

*22. An apparatus according to claim 21, wherein the cradle is tilted with respect to the rotor such that a radially outer bottom edge of the cradle is disposed on a bottom surface of the rotor and a radially inner bottom edge of the cradle is disposed above the bottom surface of the rotor.*

*23. An apparatus according to claim 22, further including a spacer attached to the cradle and abutting the container to fix the oblique angle.*

*24. An apparatus according to claim 11, wherein the container opening is in fluid communication with the grooves.*

*25. An apparatus according to claim 24, wherein the carrier is tilted with respect to the rotor such that a radially outer bottom edge of the carrier is disposed on a bottom surface of the rotor and a radially inner bottom edge of the carrier is disposed above the bottom surface of the rotor.*

*26. A method according to claim 12, wherein holding the wafer includes holding the wafer in a cradle, wherein the cradle is arranged such that a radially outer bottom edge of the cradle is disposed on a first plane normal to the axis of the rotation and a radially inner bottom edge of the cradle is disposed on a second plane normal to the axis of the rotation, wherein the second plane is disposed above the first plane.*

*27. A method according to claim 26, wherein the angle of inclination of the wafers is fixed by abutment of a spacer that is attached to the carrier.*

*28. A method according to claim 12, wherein rotating the wafer about the axis of the rotation includes drying the wafer until no drops of the liquid remain on the surface of the wafer.*

*29. An apparatus according to claim 20, wherein the container opening is in fluid communication with the grooves.*

*30. An apparatus according to claim 29, wherein the cradle is tilted with respect to the rotor such that a radially outer bottom edge of the cradle is disposed on a bottom*

*surface of the rotor and a radially inner bottom edge of the cradle is disposed above the bottom surface of the rotor.*

*31. An apparatus according to claim 30, wherein the stop means includes a spacer attached to the cradle and abutting the container to fix the oblique angle.*

*32. A method of drying a semiconductor wafer having a surface that was previously wetted with a liquid, said method comprising:*

*holding the wafer in a carrier;*

*tilting the carrier in a manner such that a rear bottom edge of the carrier is disposed on a rotational base plane normal to an axis of the rotation and a front bottom edge of the carrier is disposed above the base plane, and further such that the surface of the wafer is inclined at a fixed angle with respect to the base plane;*

*rotating the wafer about the axis of the rotation, to exert a centrifugal force on drops of the liquid; and*

*providing an air stream to the surface of the wafer to reduce a vibration of the wafer;*

*wherein both rotating the wafer and providing the air stream disperse the drops of the liquid on the surface of the wafer.*

*33. A method according to claim 32, wherein the angle of inclination is within the range of about 2.5° to about 30°.*

*34. The method of claim 32, wherein the surface of the wafer remains inclined at the fixed angle an entire time of the rotating.*

*35. A method according to claim 32, wherein the front bottom edge of the carrier is closer to the axis of rotation than is the rear bottom edge of the carrier.*

*36. A method according to claim 32, wherein rotating the wafer about the axis of the rotation includes drying the wafer until no drops of the liquid remain on the surface of the wafer.*

*37. A method according to claim 32, wherein tilting the carrier includes tilting the carrier until an angle of inclination of the wafers is fixed by abutment of a spacer that is disposed parallel to the bottom surface of the cradle.*

* * * * *